United States Patent [19]
Niemann

[11] Patent Number: 5,414,348
[45] Date of Patent: May 9, 1995

[54] MEASUREMENT DEVICE WITH COMMON MODE CURRENT CANCELLATION

[76] Inventor: James A. Niemann, 169 Pinehurst Rd., Monroe Falls, Ohio 44262

[21] Appl. No.: 23,600

[22] Filed: Feb. 26, 1993

[51] Int. Cl.⁶ .............................. G01R 1/20; H04B 3/28
[52] U.S. Cl. .................... 324/127; 324/132; 333/12
[58] Field of Search .............. 324/132, 130, 123 R, 324/127; 333/12; 307/89, 542, 555

[56] References Cited

U.S. PATENT DOCUMENTS

| | | | |
|---|---|---|---|
| 2,758,286 | 8/1956 | Wible, Jr. .................. | 333/12 |
| 3,243,684 | 3/1966 | Ekstrom et al. ............ | 307/89 |
| 3,513,334 | 5/1970 | Brunner et al. ............ | 307/542 |
| 3,715,673 | 2/1973 | Baum et al. ................ | 333/12 |
| 4,580,112 | 4/1986 | Winslow et al. ........... | 333/12 |
| 5,043,686 | 8/1991 | Plunkett .................... | 333/181 |

Primary Examiner—Ernest F. Karlsen

[57] ABSTRACT

The secondary of a line powered transformer supplies power to a measurement unit. The measurement unit measures between a high test terminal and a low terminal on the secondary. The low terminal is connected to a low test terminal through a common mode current sensor to a device under test. The device under test is also connected to the high test terminal. The common mode current sensor senses current through the transformer capacitance that flows through the device under test to earth ground. A current source is connected in parallel with the low terminal and earth ground. In response to the current sensor, the source dynamically drives a current through the device under test that drives the common mode current to a minimum.

2 Claims, 3 Drawing Sheets

5,414,348

MEASUREMENT DEVICE WITH COMMON MODE CURRENT CANCELLATION

BACKGROUND OF THE INVENTION

The present invention relates to devices for measuring electrical characteristics and, in particular, to a measurement device having common mode current cancellation.

Voltmeters, current meters, multimeters, source/-measure units and other electrical measurement devices are often required to make floating measurements with respect to earth ground on a device under test. If the measurement device is self-powered (e.g., battery operated), little difficulty is encountered in achieving an accurate measurement.

However, in many cases it is necessary or desirable to power the measurement device with line power (e.g., 120 volt, 60 hertz, mains). This line power or line supply is nearly always connected to earth ground (e.g., actual ground or the neutral conductor). Similarly, the device under test is also usually connected in some way to earth ground. Therefore, to provide isolation of the measurement device (as well as for other reasons), a transformer is used between the line supply and the measurement device proper.

For many applications, this isolation is sufficient, but in other applications, the capacitance between the transformer windings is sufficient to allow unacceptable levels of current to flow across the transformer and through the device under test. (The current through the device under test is also typically due to stray capacitances). Shields in the transformer can minimize this common mode current, but only so much (e.g., 2 microamperes at 60 hertz).

SUMMARY OF THE INVENTION

The present invention actively cancels this common mode current, resulting in better measurement accuracies. In addition, the invention cancels the transformer capacitance seen by ac signals on the test terminals, as well as shield capacitance. The invention can be extended to eliminate common mode currents between other floating electrical devices as well, whether via a ground path or other paths.

The common mode current flowing in a connection between two electrical devices at a floating voltage potential can be cancelled by providing the connection with a current sensor for sensing the flowing common mode current. A common mode current source is connected in parallel with the flowing common mode current. The source provides a common mode current in response to the sensed current that drives the flowing common mode current to a minimum value.

The apparatus for cancelling a common mode current flowing in a connection between two electrical devices at a floating voltage potential includes a common mode current sensor for insertion in the connection and a common mode current source controlled by the sensor for connection in parallel with the flowing common mode current. The source provides a current that cancels the flowing common mode current.

The electrical measurement device has a low test terminal and a high test terminal. These test terminals are isolated from earth ground and are adapted to be connected to a device under test. The measurement device includes a transformer having a primary winding adapted to be line powered and a secondary winding having a low terminal. It also includes a measurement means adapted to be powered from the secondary winding. The measurement means measures between the high test terminal and the low terminal.

A current sensor is connected in series between the low terminal and the low test terminal for sensing a current between the low terminal and earth ground.

A current source is connected in parallel with the low test terminal and the earth ground. The current source is adapted to provide a current to the device under test that cancels the sensed current.

DESCRIPTION OF THE PREFERRED EMBODIMENTS

Figure 1:
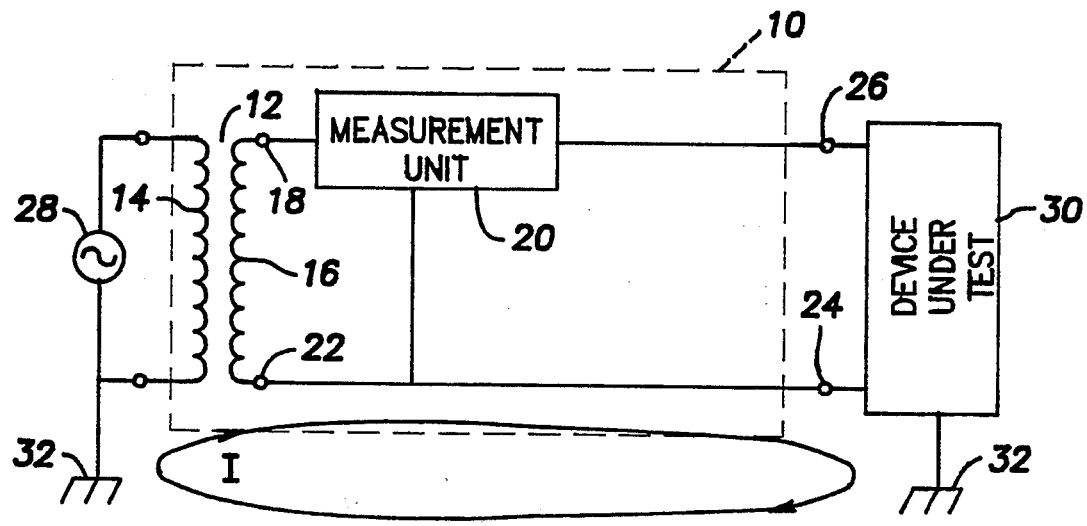
FIG. 1 is a combination schematic and block diagram of a measurement system according to the prior art.

Referring to FIG. 1, a measurement device 10 has a transformer 12 having a primary winding 14 and a secondary winding 16. The high terminal 18 of the transformer 12 is connected to the power input of the measurement unit 20. The low terminal 22 of the transformer 12 is connected to the common terminal of the measurement unit 20 and to the low test terminal 24. The measurement terminal of the measurement unit 20 is connected to the high test terminal 26.

The primary 14 of the transformer 12 is powered by line power or supply 28 (e.g., 120 volt, 60 hertz).

The measurement unit 20 may be, for example, a voltmeter, current meter, multimeter, a source unit, or a source/measure unit. Operating power is supplied to the measurement unit 20 by the terminals 18, 22. The measurement unit 20 makes measurements with respect to the test terminals 24, 26.

It is also possible to power the measurement unit 20 from the transformer 12 in other ways. For example, the low terminal 22 may be a center tap on a winding where power is supplied to the measurement unit 20 by the terminal 18 and another unshown terminal as is well-known in full-wave dc power supplies.

In some instances, the measurement unit 20 may not even be powered. For example, it could be a resistance switching box.

In operation, a device under test (DUT) 30 is connected between the test terminals 24, 26 and the desired measurement is made by the measurement device 10.

However, because of capacitance between the windings 14, 16 of the transformer 12, a common mode current I will in general flow through the DUT 30 to earth ground 32, returning to the line supply 28. Because it flows largely through small capacitances, the common mode current I leads the voltage by close to 90°.

Internal shielding of the transformer 12 can reduce the winding capacitance (e.g., to 20 picofarads). Reducing this capacitance reduces the common mode current I, but the current I may still be unacceptably high (e.g., 2 microamperes at 60 hertz). In many cases, this will effect the accuracy of measurements by the measurement device 10.

Figure 2:
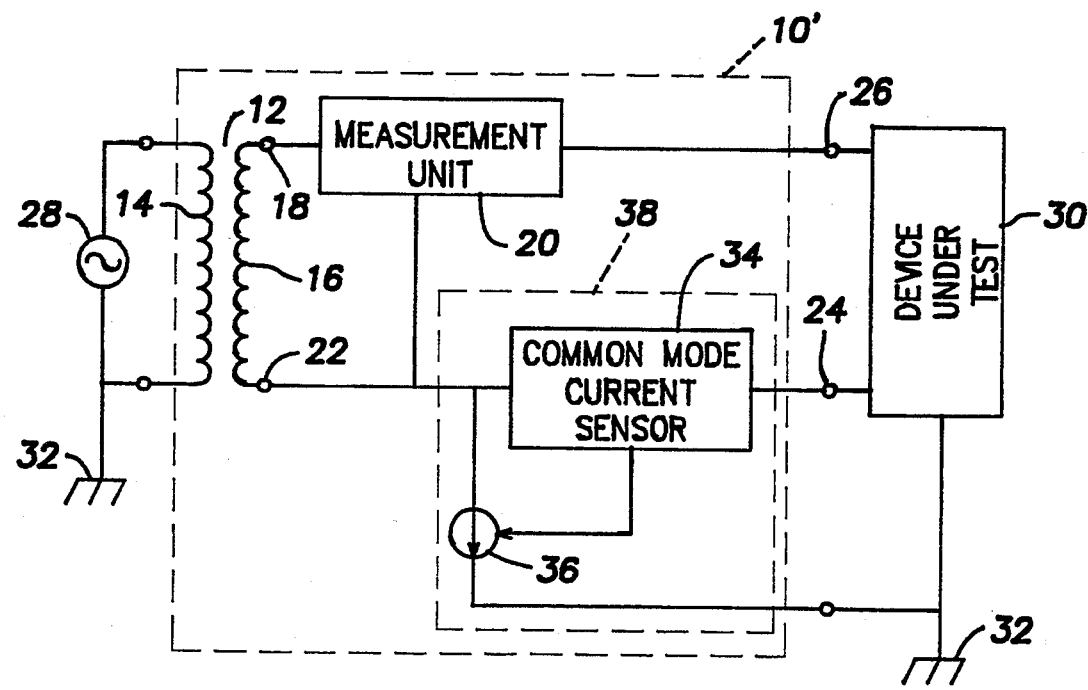
FIG. 2 is a combination schematic and block diagram of a measurement system according to the invention.

Referring to FIG. 2, an improved measurement device 10' includes a common mode current sensor 34 inserted in series between the low terminal 22 and the low test terminal 24. The common terminal of the measurement unit 20 is connected to the low terminal 22. The common mode current sensor 34 senses the current between the low terminal 22 and the earth ground 32.

A variable current source 36 is connected in parallel between the low terminal 22 and the earth ground 32. Under control from the current sensor 34, the source 36 forces a current from the earth ground 32 through the DUT 30, the current sensor 34 and the low test terminal 24 that cancels the common mode current through the current sensor 34. The common mode current can be reduced, for example, to less than 1 nanoampere at 60 hertz.

This cancellation of the common mode current takes place dynamically, whatever current exists is driven to a minimum.

Figure 3:
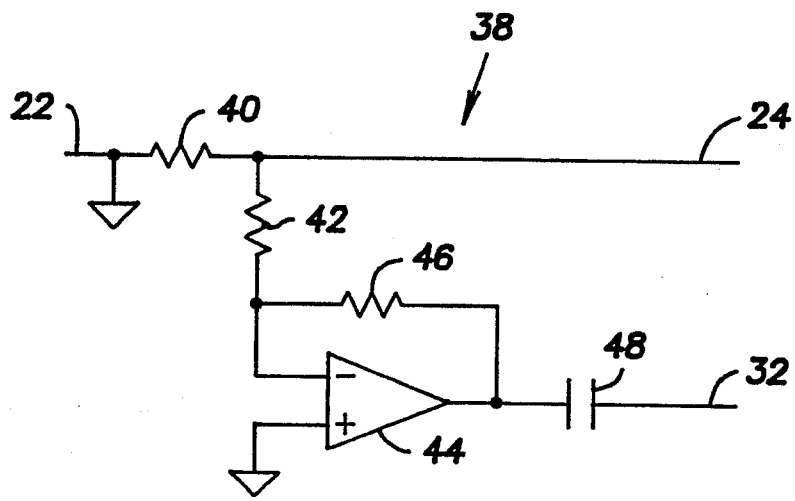
FIG. 3 is a schematic diagram of a common mode current sensor and current source according to the invention.

Referring to FIG. 3, a circuit 38 implementing the sensor 34 and source 36 combination includes a first current sensing resistor 40 in series with the low terminal 22 and the low test terminal 24. A second current sensing resistor 42 is connected from the low test terminal 24 to the inverting input of an operational amplifier 44. The unshown power supplies for the operational amplifier 44 are derived with respect to the low terminal 22.

A feedback resistor 46 is connected between the output of the amplifier 44 and the inverting input of the amplifier 44. The non-inverting input of the amplifier 44 is connected to the low terminal 22.

The output of the amplifier 44 is connected through a capacitor 48 to the earth ground 32. The capacitor 48 may be, for example, 1,000 picofarads.

In operation, the current sensing resistors 40, 42 sense the common mode current through the DUT 30 as a voltage drop. The feedback resistor 46 is used to establish the gain of the circuit This gain may be, for example, on the order of $-10^9$. 38.

The operational amplifier 44 drives a current through the capacitor 40, the DUT 30 and the sensing resistors 40, 42 that forces the inverting input of the amplifier 44 to the same potential as the low terminal 22.

The capacitor 48 isolates the circuit 38 from earth ground 32 and provides a 90° phase shift in the current from the voltage of the amplifier 44. The current from the capacitor 48 cancels the common mode current through the DUT 30 and the sensing resistors 40, 42.

This cancellation takes place independently of the potential of the low terminal 22 with respect to the high test terminal 26, only the common mode current is cancelled.

Figure 4:
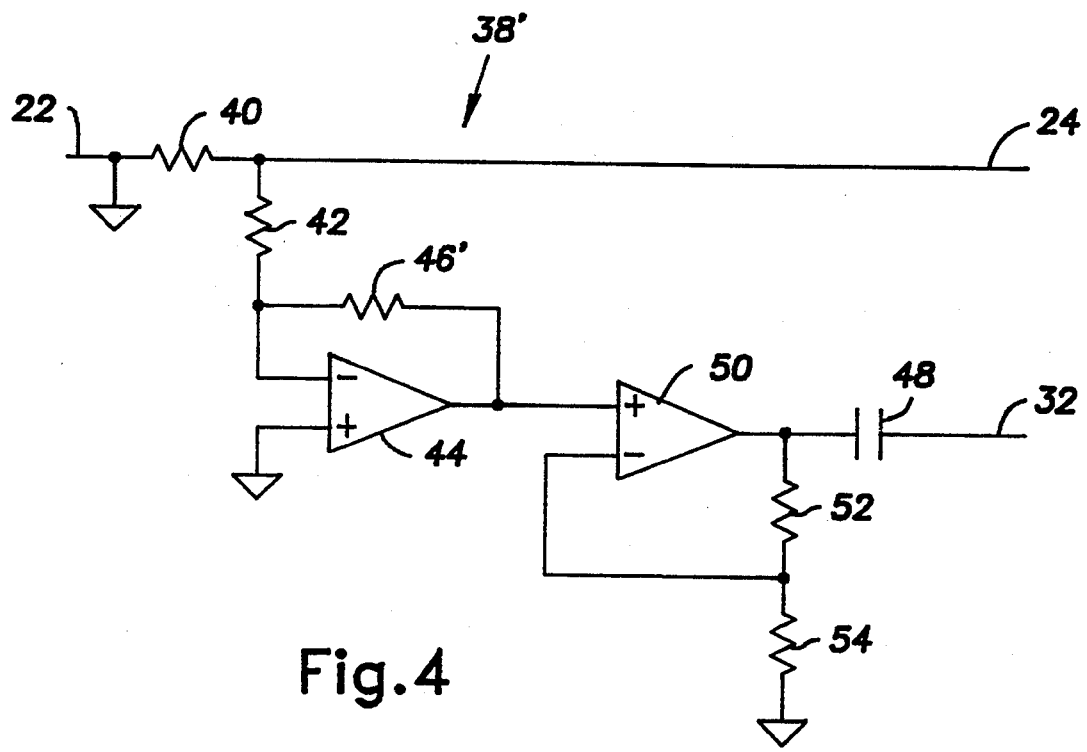
FIG. 4 is a schematic of another embodiment of a common mode current sensor and current source according to the invention.

Referring to FIG. 4, an alternate circuit 38' for implementing the sensor 34 and source 36 combination is similar to the circuit 38 except that the non-inverting input of an additional operational amplifier 50 is connected to the output of the amplifier 44 and the capacitor 48 connected to the output of the amplifier 50. The resistors 52, 54 establish the gain contributed by the addition of the amplifier 50.

The circuit 38' lessens the gain expected from the amplifier 44, but otherwise functions similarly. For example, the current sensing resistors 40, 42 provide a current ratio of 500, the amplifier 44 may contribute a gain of 2,000, while the amplifier 50 contributes a gain of 300.

Exemplary values for the resistors 40, 42, 46, 46', 52, 54 are 1k, 1k, 600M, 2.2M, 30K and 100 ohms, respectively.

In addition to cancelling the common mode current, the measurement device 10' also cancels the transformer capacitance seen by ac voltages on the low test terminal 24 within the bandwidth of the circuits 38, 38'. In fact, not only is the transformer capacitance cancelled, but also, shield capacitance or any other stray capacitance is cancelled.

This cancellation takes place dynamically, whatever capacitance exists is driven to a minimum. The bandwidth of the circuits 38, 38' may be, for example, 200 kilohertz.

Figure 5:
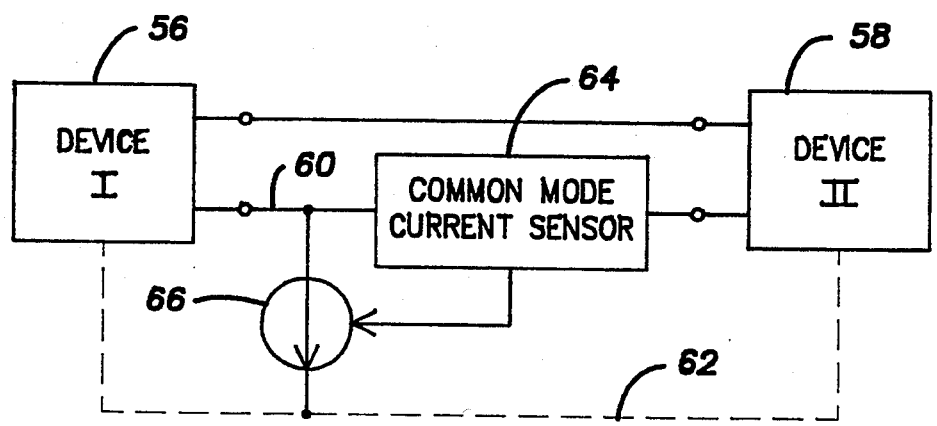
FIG. 5 is a combination schematic and block diagram of another apparatus according to the invention.

Referring to FIG. 5, it should be noted that the invention may be applied to any pair of connected electrical devices 56, 58 at a floating voltage potential that have a common mode current flowing in the connection 60. This current may be returning by earth ground or by any other undesired path 62.

The connection 60 is provide with a current sensor 64 for sensing the common mode current.

A common mode current source 66 is connected in parallel with the connection 60 and the path 62.

In operation, current from the source 66 is controlled by the common mode current sensed by the sensor 64. In response to the sensed current, the source 66 drives the common mode current to a minimum value (e.g., zero).

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for cancelling common mode current in an electrical measurement device having a low test terminal and a high test terminal, said method comprising:

providing an isolation transformer having a primary winding connected to a line supply and a secondary winding having a low terminal;

providing a measurement means powered from said secondary winding, said measurement means measuring between said high test terminal and said low terminal;

connecting a device under test between said test terminals;

connecting a current sensor in series between said low terminal and said low test terminal and sensing a current between said low terminal and an earth ground; and connecting a current source in parallel with said low test terminal and said earth ground, said current source providing a current to said device under test that cancels said sensed current.

2. A method according to claim 1, wherein said current source is controlled by said current sensor and drives said sensed current to a minimum value.

* * * * *